(12) United States Patent
Murai et al.

(10) Patent No.: US 6,340,545 B1
(45) Date of Patent: Jan. 22, 2002

(54) PHOTOSENSITIVE RESIN COMPOSITION, METHOD OF FORMING PATTERNS, PHOTOSENSITIVE LIQUID FOR FORMING COLORED IMAGES, AND COLOR FILTER

(75) Inventors: Tatsuhiko Murai; Tadahiro Furukawa, both of Bunkyo (JP)

(73) Assignee: Kyodo Printing Co., Ltd., Tokyo (JP)

( * ) Notice: Subject to any disclaimer, the term of this patent is extended or adjusted under 35 U.S.C. 154(b) by 0 days.

(21) Appl. No.: 09/520,232

(22) Filed: Mar. 7, 2000

(30) Foreign Application Priority Data

Mar. 8, 1999 (JP) .......................... 11-060096
Jun. 11, 1999 (JP) .......................... 11-165486

(51) Int. Cl.⁷ .................. G02B 5/20; G02F 1/1335; G03F 7/039; G03F 7/30
(52) U.S. Cl. .................. 430/7; 430/270.1; 430/326; 430/330
(58) Field of Search .................. 430/7, 270.1, 326, 430/330

(56) References Cited

U.S. PATENT DOCUMENTS 4,920,182 A * 4/1990 Manser et al. .............. 525/438
4,957,946 A * 9/1990 Meier et al. .................. 522/59

OTHER PUBLICATIONS

Sutherland, R.G. et al. "Hydrogenation of Aromatic Ligands . . . " Journal of Organometallic Chemistry, 101 (1975) p. 221–229.
Morrison, W.H. et al., "Reaction of Ferrocene with Polyaromatic Molecules . . . " Journal of the Am. Chem. Soc., 96:11, May 29, 1974, p. 3603–3608.
Meler, K. et al., "Imaging With Iron Arene Photoinitiators," J. of Imaging Science, vol. 30, No. 4, Jul./Aug. 1986, p. 174–77.

* cited by examiner

Primary Examiner—John A. McPherson
(74) Attorney, Agent, or Firm—Pitney, Hardin, Kipp & Szuch LLP (57) ABSTRACT

A photosensitive resin composition and a photosensitive liquid for forming colored images are produced from (1) a resin comprising molecules having carboxyl groups and (2) an arene compound,

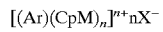

$[(Ar)(CpM)_n]^{n+}nX^-$ wherein Ar denotes an aromatic compound; M denotes a metal cation; Cp denotes an anion of cyclopentadiene; X denotes an anion; and n denotes a positive integer. Especially, an arene compound, $[(Ar)(CpM)_2]^{2+}2X^-$, can realize a photosensitive resin composition with excellent stability and photosensitivity, a photosensitive liquid for forming colored images with excellent light resistance, and color filters.

10 Claims, 2 Drawing Sheets

FIG. 2

PHOTOSENSITIVE RESIN COMPOSITION, METHOD OF FORMING PATTERNS, PHOTOSENSITIVE LIQUID FOR FORMING COLORED IMAGES, AND COLOR FILTER

BACKGROUND OF THE INVENTION

1. Field of the Invention

The present invention relates to a photosensitive resin composition, a method of forming patterns using the composition, a photosensitive liquid for forming colored images, and a color filter.

2. Description of the Related Art

The necessity of a photosensitive resin with excellent stability and photosensitivity has extremely increased in a pattern formation process during manufacture of semiconductor devices as well as in a process of manufacturing a color filter for use in liquid crystal displays and image devices. Such a resin is also required to have good resistance to heat that is applied during the process of manufacturing it and when it is used.

Various photosensitive resins have heretofore been proposed and employed in practice. A photosensitive polyimide resin has recently received attention, because of such advantages that it can be patterned without a photoresist to produce a physically and chemically stable layer with excellent heat resistance after it is cured.

Photosensitive polyimide resins have a photosensitive group introduced into a soluble polyamic acid that is a precursor of polyimide. Other photosensitive polyimide resins have a photosensitive group directly introduced into a solublized polyimide. In either case, there are a lot of resins that have properties of the photocuring type, or negative type. A positive photosensitive polyimide resin having an o-nitrobenzyl group introduced therein is also reported as a polyimide precursor.

There is also proposed another positive photosensitive resin that has a specific metal complex added in an acrylic, phenolic, polyester or polyurethane resin (JP-10-153863A).

The above-mentioned photosensitive polyimide resin has a structure in which a photosensitive group is introduced into a polyimide resin precursor. In negative resins, a light-illuminated part becomes insoluble. On the other hand, in positive resins, a light-illuminated part becomes soluble and thus the resin can advantageously be patterned without a photoresist.

A colorant such as a dye or pigment is added into a conventional photosensitive polyimide resin to produce color filters. Some colorants added, however, inhibit the crosslinking reaction of photosensitive groups and cause the fading of the filters. That is, some color filters are insufficient in light resistance and poor in aging resistance. Therefore, it is desired to develop photosensitive polyimide resins improved in these properties.

SUMMARY OF THE INVENTION

Accordingly, a first aspect of the present invention is to provide a photosensitive resin composition excellent particularly in stability and photosensitivity.

A second aspect of the present invention is to provide a method of forming a pattern using such a photosensitive resin composition.

A third aspect of the present invention is a photosensitive liquid for forming colored images with excellent light resistance.

A fourth aspect of the present invention is a color filter using such a photosensitive resin composition.

In accordance with the present invention, there is provided a photosensitive resin composition, which comprises a resin having a carboxyl group in the molecule and an arene compound represented by the following formula (1):

$$[(Ar)(CpM)_2]^{2+}2X^- \qquad (1)$$

wherein Ar denotes an aromatic π-arene capable of coordinating with at least two metalcyclopentadienyl compounds; Cp denotes an anion of cyclopentadiene; M denotes a metal cation; and $X^-$ denotes any one selected from the group consisting of $SbF_6^-$, $BF_4^-$, $AsF_6^-$ and $PF_6^-$.

In accordance with the present invention, there is also provided a method of forming a pattern, which comprises applying the above-mentioned photosensitive resin composition onto a substrate, drying the composition at a temperature of 100° C. or below to produce a resinous coating, exposing the coating for a given pattern to form an exposed coating, heating the exposed coating at a temperature of 100–170° C., and carrying out development.

In accordance with the present invention, there is further provided the above-mentioned photosensitive liquid, which comprises a resin having a carboxyl group in the molecule, an arene compound represented by the following formula (2):

$$[(Ar)(CpM)_n]^{n+}nX^- \qquad (2)$$

wherein Ar denotes an aromatic compound; M denotes a metal cation; Cp denotes an anion of cyclopentadiene; X denotes an anion; and n denotes a positive integer; a colorant; and a solvent.

According to the present invention, there is still further provided a color filter having a pattern. The pattern is formed by applying the above-mentioned photosensitive liquid onto a substrate; drying the liquid to produce a resinous coating; exposing the coating for a given pattern; baking and then carrying out development.

BRIEF DESCRIPTION OF THE DRAWINGS

The present invention will be more fully understood from the following detailed description with reference to the accompanying drawings in which.

DETAILED DESCRIPTION OF THE PREFERRED MODES OF EMBODIMENT

Any resin can be employed in the present invention so long as it comprises a molecule having a carboxyl group and can form a coating. Such a resin is called a polyimide resin precursor in general.

The photosensitive resin composition of the present invention is composed of a resin having a carboxyl group in the molecule and the aforementioned arene compound incorporated therein.

In practical use, a given amount of the arene compound is added into a solution of a carboxyl group-containing resin to make a photosensitive varnish, which is then applied onto the surface of an optional substrate and dried to form a photosensitive film. When the photosensitive film is exposed to light beams through a mask for any given pattern, its light-shielded part (unexposed part) becomes to have a lower solubility due to the effect of the arene compound. To the contrary, its light-illuminated part (exposed part) maintains its solubility because the light decomposes the arene compound, which loses its effect. When partial imidization is carried out under heating after exposure, solubility is adjusted and then development is carried out with a developer consisting of an alkaline aqueous solution. The exposed part can be dissolved and removed depending on the difference of solubility so as to form a pattern corresponding to the mask pattern.

It has not been elucidated theoretically what kind of reaction occurs in the photosensitive resin composition of the present invention when it is exposed to light. It is, however, inferred that the solubility of the carboxyl group-containing resin lowers at an unexposed part where the arene compound coordinates with the carboxyl group of the carboxyl group-containing resin. On the other hand, it is inferred that the solubility does not lower and remains high at an exposed part where the arene compound decomposes and does not coordinate.

The arene compound of the present invention has two coordination positions. Therefore, the crosslinking is carried out among resin molecules through the arene compound to make a three-dimensional resin structure and the resins increase in apparent molecular weight. As a result, the solubility difference between the exposed and unexposed parts increases and the photosensitive resin exhibits its excellent developing properties.

Substantially every substance, which is produced through the reaction of a diamine and an aromatic tetracarboxylic anhydride and is generally called a polyimide resin precursor, can be employed as the polyimide resin precursor of the present invention. They are represented by the following formula (4):

(4)

Diamines include aromatic diamines, aliphatic diamines and alicyclic diamines represented by the following formula (5):

$H_2N—R_2—NH_2$ (5)

The following aromatic diamines are particularly preferred: metaphenylenediamine; paraphenylenediamine; 4,4'-diaminodiphenyl methane; 4,4'-diaminodiphenyl ether; 2,2'-bis(4-aminophenyl)propane; 3,3'-diaminodiphenyl sulfone; 4–4'-diaminodiphenyl sulfone; 4,4'-diaminodiphenyl sulfide; benzidine; benzidine-3,3'-dicarboxylic acid; benzidine-3,3'-disulfonic acid; benzidine-3-monocarboxylic acid; benzidine-3-monosulfonic acid; 3,3'-dimethoxy-benzidine; p-bis(4-aminophenoxy)benzene, m-bis(4-aminophenoxy)benzene, m-xylylenediamine; and p-xylylenediamine. Among them, 4,4'-diaminodiphenyl ether; 3,3'-diaminodiphenyl sulfone; and 4,4'-diaminodiphenyl sulfone are preferably employed.

Materials suitable for the color filter according to the fourth aspect of the present invention include 3,3'-diaminodiphenyl sulfone and 4,4'-diaminodiphenyl sulfone that are transparent and colorless.

When applying the photosensitive resin composition of the present invention onto the surface of a glass substrate, several percents of a diamine containing silicon atom or atoms in its molecule are preferably used, so the photosensitive resin composition increases in adhesion to the surface of the glass substrate. An example of such a silicon-containing diamine is represented by the formula (6):

(6)

In the present invention, such an aromatic tetracarboxylic anhydride employed to polymerize with the above-mentioned diamine is represented by the following formula (7):

(7)

The anhydride definitely includes: pyromellitic anhydride; 3,3',4,4'-benzophenone tetracarboxylic dianhydride; 3,3',4,4'-biphenyl tetracarboxylic dianhydride; 2,3,3',4'-biphenyl tetracarboxylic dianhydride; 2,3,6,7-naphthalene tetracarboxylic dianhydride; 1,2,5,6-naphthalene tetracarboxylic dianhydride; 1,4,5,8-naphthalene tetracarboxylic dianhydride; 2,2'-bis(3,4-dicarboxyphenyl)propane dianhydride; bis(3,4-dicarboxyphenyl)sulfone dianhydride; 3,4,9,10-perylene tetracarboxylic dianhydride; bis(3,4-dicarboxyphenyl)ether dianhydride; 2-2'-bis(2,3-dicarboxyphenyl)propane dianhydride; 1,1'-bis(2,3-dicarboxyphenyl)ethane dianhydride; benzene-1,2,3,4-tetracarboxylic dianhydride; 2,3,6,7-anthracene tetracarboxylic dianhydride; and 1,2,7,8-phenanthrene tetracarboxylic dianhydride. Among them, pyromellitic anhydride; 3,3',4,4'-benzophenone tetracarboxylic dianhydride; and 3,3',4,4'-biphenyl tetracarboxylic dianhydride are preferably employed.

Polymerization of a diamine and an aromatic tetracarboxylic anhydride can be carried out in accordance with a conventional method. For example, it can be carried out in a nitrogen gas flow in the presence of an organic solvent along with a temperature controlled at 60° C. or below, preferably below 30° C.

High polarity basic solvents are used as the organic solvent, such as N-methyl-2-pyrrolidone; N,N'-dimethylacetamide; N,N'-dimethylformamide; dimethylsulfoxide; and hexamethylphosphoramide. These solvents each have high moisture absorption. Therefore, it is preferred to dehydrate absorbed water with a dehydrating agent prior to the use of the solvents because the absorbed water reduces the molecular weight of a product during polymerization and the stability of the product during storage. Organic solvents such as toluene, xylene, benzonitrile, benzene and phenol may also be used with these solvents, if required.

The thus-obtained polyimide resin precursor has a structure in which bond units containing a diamine and an aromatic tetracarboxylic anhydride through an amide bond join with each other or with one another at random as shown in the above-mentioned formula (4).

In the first and second aspects of the present invention, an arene compound to be added to such a polyimide resin precursor is a compound as represented by the above-mentioned formula (1).

In the first and second aspects of the present invention, the arene compound of the present invention has two coordination positions. Therefore, the crosslinking is carried out among resin molecules through the arene compound to make a three-dimensional resin structure and the resin increases in apparent molecular weight. As a result, the solubility difference between the exposed and unexposed parts increases and the photosensitive resin exhibits its excellent developing properties.

The π-arene represented by Ar in the formula (1) includes particularly aromatic compounds with a carbon number of 12–24 and heteroaromatic compounds with a carbon number of 6 or more, which are possible to coordinate with at least two metalcyclopentadienyl compounds. These groups may not be substituted but may also be mono- or multi-substituted by the same or different monovalent groups such as halogen atoms, $C_1$–$C_8$ alkyl groups, $C_1$–$C_8$ alkoxy groups, cyano group, $C_1$–$C_8$ alkylthio groups, $C_2$–$C_6$ monocarboxylic acid ester groups and $C_2$–$C_6$ alkanoyl groups. These π-arene groups may be monocyclic, condensed polycyclic or non-condensed polycyclic moieties. In non-condensed polycyclic moieties, aromatic rings may bond with each other directly or through a crosslinking group such as —S— or —O—.

Each substituent of the above-mentioned alkyl group, alkoxy group, alkylthio group, monocarboxylic acid alkylester group and alkanoyl group is a linear chain or branched chain. The alkyl group typically includes methyl, ethyl, n-propyl, isopropyl, n-butyl, sec-butyl, tert-butyl, n-pentyl, n-hexyl and n-octyl. The alkoxy group typically includes methoxy, ethoxy, n-propoxy, isopropoxy, n-butoxy, n-hexyloxy and n-octyloxy. The alkylthio group typically includes methylthio, ethylthio, n-propylthio, isopropylthio, n-butylthio, n-benzylthio and n-hexylthio. The monocarboxylic acid alkylester group typically includes carboxylic acid methylester group, carboxylic acid ethylester group, carboxylic acid n-propylester group, carboxylic acid isopropylester group, carboxylic acid n-buthylester group, and carboxylic acid n-pentylester group. The alkanoyl group typically includes acetyl, propionyl and butyryl. It is preferred that the above-mentioned alkyl group, alkoxy group, alkylthio group and monocarboxylic acid alkylester group have 1–4, especially one or two, carbon atoms in their alkyl parts. It is also preferred that the above-mentioned alkanoyl group has two or three carbon atoms.

Examples of the π-arene include biphenyl, fluorene, phenanthrene, anthracene, 9,10-dihydroanthracene, triphenylene, pyrene, naphthacene, xanthene, thioxanthene, thianthrene, diphenyleneoxide, diphenylenesulfite, acridine, phenothiazine, phenoxazine, binaphthyl, biphenyl, diphenylmethane, diphenylethane and carbazole.

In the formula (1), M includes a cation of chromium, cobalt, manganese, tungsten, iron or molybdenum, preferably a cation of iron, most preferably $Fe^{2+}$.

In the third and fourth aspects of the present invention, an arene compound to be added to such a polyimide resin precursor is a compound as represented by the above-mentioned formula (2).

In the third and fourth aspects of the present invention, an aromatic compound denoted by Ar in the arene compound represented by the above-mentioned formula (2) may include one that can coordinate with a metalcyclopentadienyl compound, preferably one that can coordinate with plural metalcyclopentadienyl compounds. Monocyclic compounds such as benzene and substituted benzenes may be exemplified. A compound that couples two monocyclic compounds through a methylene diamine compound or dioxy compound to coordinate with plural metalcyclopentadienyl compounds may also be exemplified.

Condensed polycyclic compounds such as anthracene and pyrene and heteropolycyclic compounds such as phenothiazine, phenazine and phenoxazine may also be employed.

Metals represented by M include a cation of chromium, cobalt, manganese, tungsten, iron or molybdenum, preferably a cation of iron, most preferably $Fe^{2+}$.

In particular, the arene compound that coordinates with at least two metalcyclopentadienyl compounds can exhibit sufficient characteristics even if it is added to the polyimide resin precursor by 20% or below, or 10% or below in some cases and hardly lowers the heat resistance of the polyimide resin precursor. This is one of great merits when a color filter with excellent characteristics is manufactured.

The arene compound includes a compound represented by the following formula (3):

(3)

wherein X denotes an anion such as $PF_6^-$, $SbF_6^-$, $AsF_6^-$ and $BF_4^-$; Y denotes NH, O or S; and R denotes an alkyl, phenyl, and biphenyl alone or in combination, or coupled in a coupling group by dimethylsiloxane, oxygen, and nitrogen.

Examples of R in the formula (2) include:

(8)

(9)

(10)

This arene compound is obtained through a nucleophilic displacement reaction between $H_2N$—R—$NH_2$ and a compound represented by the following formula (11):

(11)

Other compounds obtained by causing HO—R—OH or HS—R—SH to react therewith, instead of H$_2$N—R—NH$_2$, may also be employed.

The compounds of the formulas (1) and (2) can be synthesized according to conventional methods.

Although there is no particular limit to the amount of an arene compound added to the carboxyl group-containing resin in the present invention, a preferred amount is 1–100 wt. %; a more preferred amount, 3–80 wt. %, on the basis of a solid content weight of the carboxyl group-containing resin.

The photosensitive resin composition of the present invention is applied onto the surface of a substrate by an appropriate means such as spin coating. Then, the thus-obtained coated product is heated at a temperature of 100° C. or below to evaporate remaining solvent, thereafter exposed to light beams from a light source such as a mercury lamp through any mask pattern. When the substrate is baked at a temperature of 100–170° C., the solubility lowers at unexposed parts and is still high at exposed parts. Therefore, cleaning, or developing, of the coated product with an alkaline solution such as a diluted aqueous solution of sodium hydroxide allows only a positive pattern to remain corresponding to the mask pattern.

Further heating of the pattern advances imidization of the rest of the carboxyl group-containing resin so that a pattern with high chemical and mechanical strength can be obtained. It is optimal to perform baking between the exposure and the development for about 3–15 minutes on a hot plate or for about 15–60 minutes in a clean oven.

Either dye or pigment can be employed as a colorant of the present invention. In pigments, it is preferred to select one that is excellent in transparency, particle diameter and dispersibility. For example, pigments of phthalocyanine, azo, indigo, dioxazine, perylene and quinacridone are available. Preferred pigments include those shown in Tables 1 and 2.

TABLE 1

| Structure | C.I. No. |
|---|---|
|  | Pigment Red 177   Red |
|  | Pigment Blue 15   Blue (ε phthalocyanine) |

TABLE 1-continued

| Structure | C.I. No. | |
|---|---|---|
| [structure of poly-Br-Cl-Cu-phthalocyanine] | Pigment Green 36 (Poly-Br—Cl—Cu-phthalocyanine) | Green |

TABLE 2

| Structure | C.I. No. | |
|---|---|---|
| [structure of bis-barbituric acid isoindoline] | Pigment Yellow 139 | Red and Green |
| [structure of dioxazine violet] | Pigment Violet 23 | Blue |

Conventional dyes may be employed. Preferred examples of dyes are shown in Tables 3 and 4. If a dye is employed as a colorant, it advantageously displays sensitization function in addition to coloring function.

TABLE 3

| Structure | Typical dye | Feature |
|---|---|---|
| [Triphenylmethane structure with $R_1R_2N$—, $R_3$, and $=NR_1R_2^+$ groups] Triphenylmethane | Acid Blue 9<br>Acid Blue 83<br>Acid Blue 90<br>Acid Green 16 | Slightly poor in heat resistance (up to 220° C.)<br>Clear color<br>Violet to Green (Cyanine) |

TABLE 3-continued

| Structure | Typical dye | Feature |
|---|---|---|
|  Xanthene | Acid Red 87<br>Acid Red 92<br>Acid Red 52 | Excellent in light fastness and heat resistance<br>Clear color<br>Red (magenta) |

TABLE 4

| Structure | Typical dye | Feature |
|---|---|---|
|  An azo, a representative example within () | Acid Yellow 42<br>Acid Red 114 | Slightly poor in light fastness<br>Yellow to Red |
|  One example of the metallic complex salt of an azo | Solvent Yellow 21<br>Solvent Yellow 63<br>Solvent Red 130<br>Solvent Red 132 | Excellent in light fastness and heat resistance<br>Slightly poor in clearness of color<br>Yellow to Red |

Further, silane coupling agents and various additives such as water repellents and oil repellents as disclosed in JP-61-180202A may be added to the above-mentioned components, if required.

In the present invention, a photosensitive liquid for forming a colored image is applied onto the surface of any substrate and dried (baked) to form a photosensitive film. This photosensitive film causes a solubility difference corresponding to a developing solution between the light-illuminated part (exposed part) and the light-shielded part (unexposed part) when it is exposed to light beams through any mask pattern. Next, a developing process is performed to dissolve the exposed or unexposed part of the photosensitive film in a solvent and then postbaking is carried out to configure a color filter with a pattern corresponding to the mask pattern.

It has not been theoretically elucidated yet what kind of reaction occurs in a photosensitive liquid for forming a colored image of the present invention when it is exposed to light beams, though either positive or negative pattern can be obtained in accordance with process conditions.

A photosensitive liquid for forming a colored image of the present invention is obtained by dissolving the above-mentioned polyimide resin precursor and arene compound into a solvent. Preferred solvents include a mixture of a good solvent for the polyimide resin precursor, such as N-methyl-2-pyrrolidone and N,N'-dimethylacetamide disclosed in JP-62-147402A and JP-6-57418A and a poor solvent such as glycolethers and cyclohexanone or non-solvent. Mixing of the good solvent, poor solvent and non-solvent appropriately can suppress the affection of the solvents to a previously formed pattern and can suitably control the evaporation speed thereof from the spin-coated surface of a substrate such as glass. Thus, an even and uniform pattern without air bubbles can be obtained.

A photosensitive liquid for forming a colored image of the present invention is applied onto the surface of a substrate by an appropriate means such as spin coating. The thus-obtained product is then dried (pre-baked) at a relatively low temperature, for example, 100° C. or below. Thereafter, it is exposed to light beams from a light source such as a super high-voltage mercury lamp through any mask pattern. When the substrate is baked next at a temperature of 100–170° C., a solubility difference according to a developing solution occurs between the unexposed and exposed parts. Therefore, developing of the product with the developing solution allows a pattern to remain corresponding to the mask pattern.

The use of an alkaline solution such as a diluted aqueous solution of sodium hydroxide as the developing solution forms a positive pattern. On the other hand, the use of an organic solvent such as cellosolve forms a negative pattern in accordance with exposing and developing conditions.

As described above, the use of the same developing solution may form either positive or negative pattern in accordance with heating conditions at baking after exposure.

It is preferred, however, to employ the alkaline aqueous solution for the positive pattern in view of the characteristics of a film remaining ratio and other values at the time of developing. It is optimal to perform baking between the exposure and the development for about 3–5 minutes on a hot plate or for about 15–60 minutes in use of a clean oven. In some cases, if a photosensitive liquid for forming colored images is coated, the thus-obtained product is baked at a temperature of 100° C. or above, exposed and developed, a pattern can be formed through a single baking process. In this case, the sensitivity may sometimes lower. If the pattern is formed as enough as it can be employed, there is no particular problem. Rather, it is more efficient due to merely the single baking process.

Baking (heating) of this pattern at a temperature of 200° C. or above can advance imidation of the rest of (non-bridged) polyimide resin precursor, resulting in a pattern that is excellent in chemical and mechanical strength.

A color filter can be manufactured by repeating several times the above-mentioned process that includes exposing patterns through desired masks and developing so that patterns with three colors of R, G and B or Y, M and C can be formed.

Figure 1:
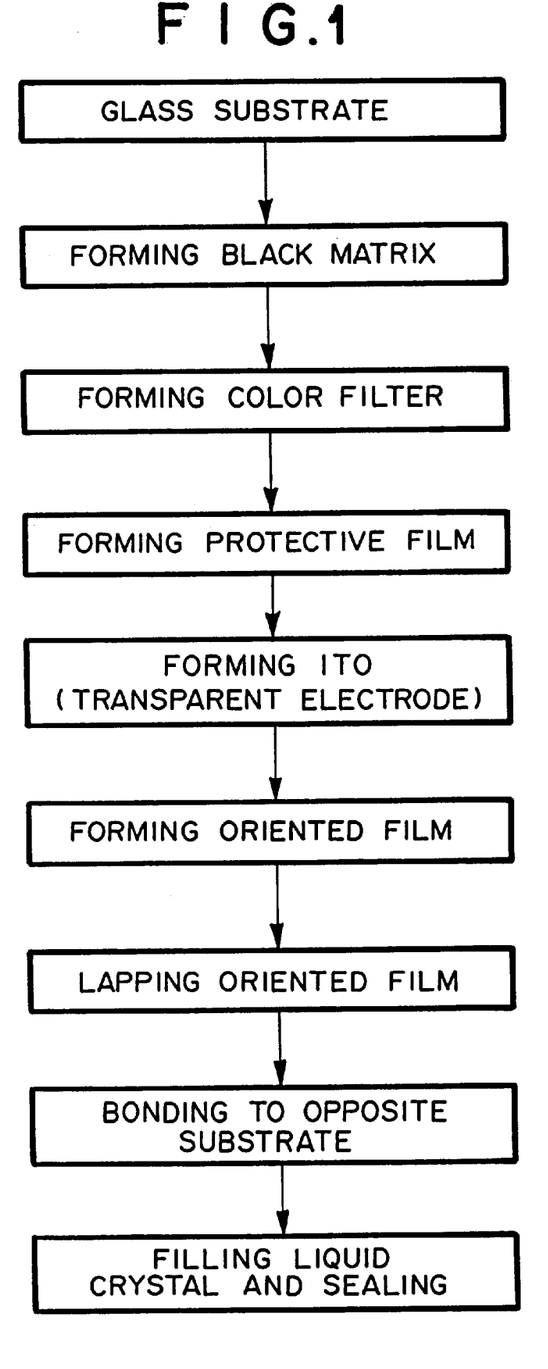
FIG. 1 is an example of block diagram showing steps from manufacturing color filters to realizing panels.

FIG. 1 shows an example of a process from the manufacture of color filters to the realization of liquid crystal panels.

It can be considered as an important advantage that the color filter of the present invention has excellent light resistance. The color filter can not be damaged by oxygen because it is used in such a state that it is put in a gap between two glass plates and liquid crystal is injected therein. Therefore, sufficient light resistance may be achieved even if such a dye is employed that has heretofore been determined to be generally poor in light resistance (see JP-6-59114A).

It is recently required, however, to thin colors of patterns in the color filter in order to ensure a bright color even when light passes twice in such a manner as in a color filter for the reflection type of LCD. In this case, the color filter loses its light resistance greatly even in such a state that it is put in a gap between two glass plates and oxygen is shut out therefrom. The arene compound of the formula (1) functions as a metallic complex. Accordingly, it is not necessary to add such a metallic additive as disclosed in JP-10-288708A in order to improve the light resistance.

The present invention will further be detailed below in accordance with examples.

EXAMPLE 1

A mixture of 3.72 g (20 mmol) of ferrocene, 6.40 g (48 mmol) of $AlCl_3$, 0.11 g (4 mmol) of Al, 0.80 g (4 mmol) of phenothiazine and 50 ml of decalin was agitated in a flask under nitrogen atmosphere at 150° C. for 4 hours to cause a reaction among them. After the temperature of the product came down to room temperature, the flask was cooled with ice, 100 ml of water was added into it and agitation was carried out for 1.5 hours. After separating and filtering of the water layer, the remainder was cleaned with cyclohexane, 8 g of $NH_4PF_6$ dissolved in 20 ml of water was added therein and agitation was carried out. After absorbing, filtering and drying of the precipitation, recrystallization of the precipitation was carried out with acetone/dioxane to obtain crystals of $[\eta^6, \eta^6$-phenothiazine]bis($[\eta^5$-cyclopentadienyl]iron(II))dihexafluorophosphate.

Then, 1.75 g of the above-mentioned $[\eta^6, \eta^6$-phenothiazine]bis($[\eta^5$-cyclopentadienyl]iron(II))dihexafluorophosphate was dissolved into 100 g of a solution of polyimide resin precursor (14% resin content) synthesized from 3,3',4,4'-benzophenone tetracarboxylic acid and 3,3'-diaminodiphenyl sulfone to prepare a photosensitive varnish. This varnish was spin-coated on a glass plate at 800 rpm for 12 seconds, then air-dried and thereafter heated for 3 minutes at 60° C. to evaporate the remaining solvent to form a coating.

This coating was exposed to beams generated from a super high-voltage mercury lamp through a photo mask. This exposure was estimated 1000 mJ as the intensity of radiation of h-rays. After it was processed at 150° C. for 5 minutes and then developed with an aqueous solution of 0.2% sodium hydroxide, a positive pattern for the mask was obtained. The pattern was heated at 240° C. to form a stable polyimide resin coating.

EXAMPLE 2

A mixture of 5.58 g (30 mmol) of ferrocene, 9.60 g (72 mmol) of $AlCl_3$, 0.16 g (6 mmol) of Al, 1.52 g (6 mmol) of binaphthyl and 75 ml of methylcyclohexane was agitated in a flask under nitrogen atmosphere at 90° C. for 20 hours to cause a reaction among them. The same later-treatment was performed as that of Example 1. The precipitation was recrystallized with acetone/water to obtain crystals of $[\eta^6, \eta^6$-binaphthyl]bis($[\eta^5$-cyclopentadienyl]iron(II))dihexafluorophosphate.

Then, 1.75 g of $[\eta^6, \eta^6$-binaphthyl]bis($[\eta$5-cyclopentadienyl] iron(II))dihexafluorophosphate, the crystals, was dissolved into 100 g of a solution of polyimide resin precursor (14% resin content) synthesized from 3,3',4,4'-benzophenone tetracarboxylic acid and 3,3'-diaminodiphenyl sulfone to prepare a photosensitive varnish.

This varnish was spin-coated on a glass plate at 800 rpm for 12 seconds, then a polyimide resin coating having a positive pattern was obtained through the same process as those of Example 1.

COMPARATIVE EXAMPLE 1

First, 10 g of $[\eta^6$-naphthalene][$\eta^5$-cyclopentadienyl]iron(II))hexafluorophosphate was dissolved into 100 g of a solution of polyimide resin precursor (14% resin content) synthesized from 3,3',4,4'-benzophenone tetracarboxylic anhydride and 3,3'-diaminodiphenyl sulfone to prepare a photosensitive varnish. This varnish was spin-coated on a glass plate at 800 rpm for 12 seconds, then the same process as that of Example 1 was performed to obtain a positive pattern.

The arene compounds of Examples 1 and 2 were compared with the arene compound of Comparative Example 1. In the arene compound of Comparative Example 1, a single cyclopentadienyl iron compound coordinates with its π-arene. In the arene compounds of Examples 1 and 2, cyclopentadienyl iron compounds coordinate with its π-arene at two positions. Namely, in Examples 1 and 2, the arene compound coordinates with the carboxylic groups of the polyimide resin precursors at two positions so that the crosslinking is carried out between the polyimide resin precursors through the arene compound, resulting in a three dimensional structure and an increase in apparent molecular weight.

As a result, the solubility difference between the exposed and unexposed parts increases larger than that of Comparative Example 1 whose precursors do not have a crosslinking structure therebetween. In addition, the film remaining ratio at development of the photosensitive resin was a value obtained by dividing a film thickness after development by an original film thickness and was extremely improved.

The following Table 5 shows comparison values among the film remaining ratios of Examples 1, 2 and Comparative Example 1.

TABLE 5

|  | Arene compound, Ar | Content to resin solid (%) | Film remaining ratio (%) |
|---|---|---|---|
| Example 1 | Phenothiazine | 12.5 | 83 |
| Example 2 | Binaphthyl | 12.5 | 85 |
| Comparative Example 1 | Naphthalene | 12.5 | 48 |

EXAMPLE 3

A photosensitive liquid was prepared, including the following components:

| Polyimide resin precursor (solid) (3,3'-diaminodiphenyl sulfone and benzophenone tetracarboxylic anhydride) | 1.0 g |
|---|---|
| Arene compound (the compound of the following formula (11)) | 0.14 g |
| Solvent Yellow 63 | 0.40 g |
| Silane coupling agent (KBM573: Shin-Etsu Chemical) | 0.03 g |
| N,N'-dimethylacetamide | 3.0 g |
| Ethyleneglycol monomethylether | 20.0 g |

(11)

A photosensitive liquid for forming colored images of the present invention was spin-coated on a glass plate at 500 rpm for 4 seconds. Then the thus-obtained product was air-dried, thereafter exposed and pre-baked under various conditions as indicated in Table 6. Next, postbaking was performed at 220° C. for 30 minutes.

The film remaining ratio is defined as a ratio of the thickness, 0.99 mμ, of an untreated film to the thickness of a treated film. The untreated film was obtained by spin-coating a photosensitive liquid for forming colored images of the present invention on a glass plate at 500 rpm for 4 seconds, then air-drying, thereafter postbaking at 220° C. for 30 minutes without exposing, prebaking and developing. The treated film was obtained by spin-coating and air-drying under the same conditions, then exposing and prebaking under various conditions as shown in Table 6.

A super high-voltage mercury lamp was employed for exposing. Its exposing wavelength was determined to be 365 nm.

Table 6 totally shows the results of development patterns obtained on the basis of various amounts of exposure, prebaking time and temperature, and developing time.

Figure 2:
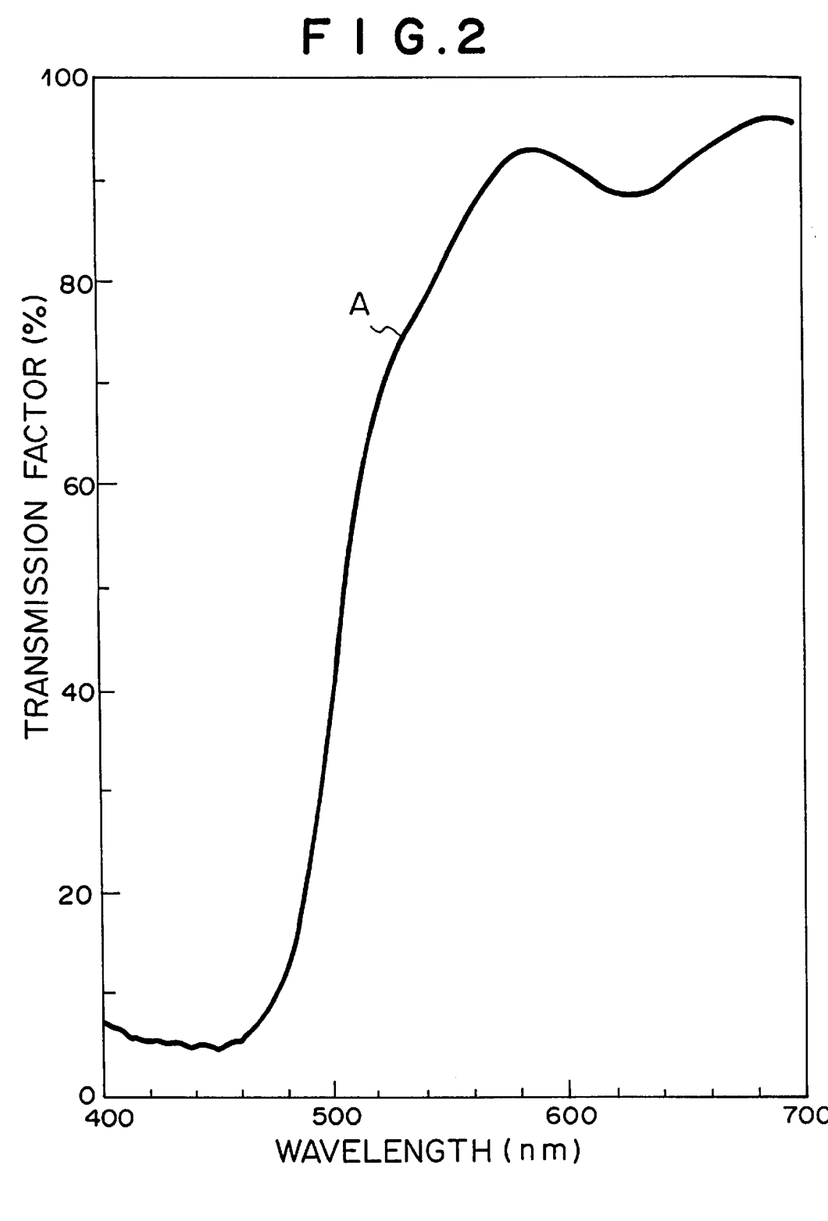
FIG. 2 is a graph showing the transmission characteristic of color filters of Example 3.

In addition, the transmission characteristic of the obtained color filters is indicated with curve A in FIG. 2.

TABLE 6

| Exposure mJ/cm² | Preba- king time | Developer (Aqueous solution) | Developing time | Develop- ment result | Film remain- ing ratio (%) |
|---|---|---|---|---|---|
| 3000 | 130° C. 300 sec | 0.1 NaOH | 20 sec | Correct | 92.9% |
| 3000 | 130° C. 300 sec | 0.1 NaOH | 30 sec | Correct | 88.9% |
| 1000 | 130° C. 300 sec | 0.1 NaOH | 30 sec | Correct to shortage | 90.9% |
| 500 | 120° C. 300 sec | 0.1 NaOH | 30 sec | Correct | 94.9% |
| 500 | 120° C. 300 sec | 0.1 NaOH | 37 sec | Over | 95.9% |

COMPARATIVE EXAMPLE 2

A photosensitive liquid was prepared, including the following components:

| Polyimide resin precursor (solid content) (3,3'-diaminodiphenyl sulfone and benzophenone tetracarboxylic anhydride) | 1.5 g |
|---|---|
| Arene compound (the compound of the above-mentioned formula (11)) | 0.21 g |
| N,N'-dimethylacetamide | 4.5 g |
| Silane coupling agent (KBM573: Shin-Etsu Chemical) | 0.05 g |
| Ethyleneglycol monomethylether | 30.0 g |

This photosensitive liquid does not contain any colorant, differing from the photosensitive liquid of Example 3.

A photosensitive film was formed on a glass plate using this photosensitive liquid in the same manner as that of Example 3. Table 7 totally shows the results of development patterns obtained on the basis of various amounts of exposing, prebaking time and temperature, and developing time.

TABLE 7

| Exposure mJ/cm² | Preba- king time | Developer (Aqueous solution) | Develop- ing time | Develop- ment result | Film remain- ing ratio (%) |
|---|---|---|---|---|---|
| 10000 | 130° C. 300 sec | 0.1 NaOH | 40 sec | Correct | 70.3% |
| 3000 | 130° C. 300 sec | 0.1 NaOH | 28 sec | Correct | 85.7% |
| 1000 | 130° C. 300 sec | 0.1 NaOH | 40 sec | Correct | 80.2% |
| 500 | 130° C. 300 sec | 0.1 NaOH | 120 sec | Hard to develop, Pattern flows | 69.2% |
| 3000 | 120° C. 300 sec | 0.1 NaOH | 20 sec | Correct | 93.4% |

From the results shown in the tables 6 and 7, the photosensitive liquid for forming colored images of the present invention, which includes colorants such as a dye and pigment mixed therein, can be observed not to lower its sensitivity but rather improve it. Accordingly, it can be inferred that a colorant to be mixed into the photosensitive liquid for forming colored images of the present invention, especially a dye of a certain type, has the possibility of greatly improving the sensitivity of the photosensitive liquid.

As described above, the photosensitive resin composition of the present invention employs a resin with a positive photosensitivity. The photosensitive resin composition of the present invention contains a carboxyl group-containing resin and an arene compound that coordinates with cyclopentadienyl iron compounds at two positions in its π-arene. Therefore, the crosslinking is carried out among molecules of the carboxyl group-containing resin through the arene compound to make a three-dimensional resin structure and increase the resin in apparent molecular weight. As a result, the solubility difference between the exposed and unexposed parts increases and a film remaining ratio at the time of developing a photosensitive resin is extremely improved.

Unlike the case of introducing a photosensitive group into a molecule, the arene compound is simply added to the carboxyl group-containing resin. Therefore, there is a broad option of taking molecular structures of the carboxyl group-containing resin and, therefore, there is an advantage in that it is possible to impart easily photosensitivity to commercially available non-photosensitive polyimide resin precursors.

Accordingly, the photosensitive resin composition is extremely effective in a wide field including the manufacture of color filters. In addition, the present invention is not required to modify any molecular structure in order to impart photosensitivity to the carboxyl group-containing resin. Therefore, the carboxyl group-containing resin has high stability and accordingly stable films can be obtained effectively.

Further, unlike conventional photoresists, a toxic chemical such as hydrazine is not required to use. This is a great advantage in process control and environmental protection.

In addition, the photosensitive resin composition of the present invention can form a pattern according to a mask pattern easily when it is applied onto a substrate, dried, exposed, then heated at a higher temperature than that at the time of drying, and developed.

The photosensitive liquid for forming colored images of the present invention includes a colorant in a polyimide resin precursor along with a specific arene compound. Thus, photosensitivity is greatly improved, the solubility difference between the exposed and unexposed parts also increase and a film remaining ratio at the time of developing a photosensitive resin is extremely improved.

In addition, the color filter produced using the photosensitive liquid for forming colored images is particularly excellent in light resistance and is accordingly possible to maintain its stabilized performance for a long time.

Further, the use of a toxic chemical such as hydrazine is not required for etching the polyimide resin. Instead, an aqueous developer can be employed. This is a great advantage in process control and environmental protection.

What is claimed is:

1. A photosensitive resin composition comprising:
   a resin being a polyimide resin precursor obtained by polymerization reaction of a diamine and an aromatic tetracarboxylic anhydride; and
   an arene compound represented by the following formula (1):

$$[(Ar)(CpM)_2]^{2+}2X^- \quad (1)$$

where Ar denotes an aromatic π-arene capable of coordinating with at lest two metalcyclopentadienyl compounds; Cp denotes an anion of cyclopentadiene; M denotes a metal cation; and X denotes any one selected from the group consisting of $SbF_6^-$, $BF_4^-$, $AsF_6^-$ and $PF_6^-$.

2. The photosensitive resin composition of claim 1, wherein said M is an iron (Fe) ion.

3. The photosensitive resin composition of claim 1, wherein said diamine is at least one selected from the group consisting of 4,4'-diaminodiphenyl ether, 3,3'-diaminodiphenyl sulfone and 4,4'-diaminodiphenyl silfone.

4. The photosensitive resin composition of claim 1, wherein said aromatic tetracarboxylic anhydride is at least one selected from the group consisting of pyromellitic anhydride, 3,3', 4,4'-benzophenone tetracarboxylic dianhydride and 3,3',4,4'-biphenyl tetracarboxylic dianhydride.

5. The photosensitive resin composition of claim 1, wherein said arene compound is at least one selected from the group consisting of anthracene, pyrene, phenothiazine, phenoxazine, biphenyl, binaphthyl, diphenylmethane and diphenylethane.

6. A method of forming a pattern comprising:
   applying a photosensitive resin composition onto a substrate;
   drying said composition at a temperature of 100° C. or below to produce a resinous coating;
   exposing said coating for a given pattern to form an exposed coating;
   heating said exposed coating at a temperature of 100–170° C.; and
   carrying out development,
   wherein said photosensitive resin composition is a photosensitive resin composition as recited in claim 1.

7. A photosensitive liquid for forming a colored image comprising:
   a resin being a polyimide resin precursor obtained by polymerization reaction of a diamine and an aromatic tetracarboxylic anhydride;
   an arene compound represented by the following formula (2);

$$[(Ar)(CpM_n)]^{n+}nX^- \quad (2)$$

wherein Ar denotes an aromatic compound; M denotes a metal cation; Cp denotes an anion of cyclopentadiene; $X^-$ denotes an anion; and n denotes a positive integer;
   a colorant; and
   a solvent.

8. The photosensitive liquid of claim 7, wherein said M is an iron (Fe) ion.

9. The photosensitive liquid of claim 7, wherein said arene compound is a compound represented by the following formula (3):

wherein $X^-$ denotes an anion; Y denotes NH, O or S; and R denotes an alkylene, a phenylene, and a biphenylene alone or in combination, or coupled in a coupling group by dimethylsiloxane, oxygen and nitrogen.

10. A color filter having a pattern, wherein said pattern is formed using a photosensitive liquid for forming a colored image as recited in claim 7.

* * * * *